(12) United States Patent
Kato et al.

(10) Patent No.: US 8,525,610 B2
(45) Date of Patent: Sep. 3, 2013

(54) COMPOSITE ELECTRONIC MODULE AND METHOD OF MANUFACTURING COMPOSITE ELECTRONIC MODULE

(75) Inventors: Takatoshi Kato, Nagaokakyo (JP); Yasuhiro Takahashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 183 days.

(21) Appl. No.: 13/239,678

(22) Filed: Sep. 22, 2011

(65) Prior Publication Data

US 2012/0075032 A1 Mar. 29, 2012

(30) Foreign Application Priority Data

Sep. 27, 2010 (JP) ................................. 2010-215139

(51) Int. Cl.
*H01P 1/32* (2006.01)
(52) U.S. Cl.
USPC .......................................... 333/1.1; 333/24.2
(58) Field of Classification Search
USPC ................................. 333/1.1, 24.2
See application file for complete search history.

(56) References Cited

U.S. PATENT DOCUMENTS 6,943,642 B1* 9/2005 Takadate et al. ............. 333/24.2
2006/0158279 A1* 7/2006 Kinoshita .................... 333/24.2

FOREIGN PATENT DOCUMENTS

| JP | 2006-311455 A | 11/2006 |
| JP | 2007-208943 A | 8/2007 |
| JP | 2009-049879 A | 3/2009 |

\* cited by examiner

*Primary Examiner* — Stephen Jones
(74) *Attorney, Agent, or Firm* — Keating & Bennett, LLP

(57) ABSTRACT

An electronic component is mounted on a substrate so as to be in contact with a non-reciprocal circuit element. Therefore, there is no risk of the electronic component, which is arranged so as to be in contact with the non-reciprocal circuit element, being displaced as a result of being shifted by the magnetic force of permanent magnets included in the non-reciprocal circuit element and displacement of the electronic component as a result of being shifted by the magnetic force of the permanent magnets can be prevented. Therefore, since there is no risk of the electronic component being displaced by being shifted by the magnetic force of the permanent magnets, a space in which to mount a member that would function as an electromagnetic shield, such as a yoke, need not be provided on the substrate and the composite electronic module can be reduced in size and profile.

5 Claims, 11 Drawing Sheets

FIG. 2

| DISTANCE IN X DIRECTION | RESULT | EVALUATION |
|---|---|---|
| 0.3 | 5/5 | × |
| 0.7 | 5/5 | × |
| 1.1 | 4/5 | × |
| 1.3 | 0/5 | ○ |
| 1.5 | 0/5 | ○ |

FIG. 3

| DISTANCE IN Y DIRECTION | RESULT | EVALUATION |
|---|---|---|
| 0.3 | 5/5 | × |
| 0.7 | 5/5 | × |
| 0.9 | 0/5 | ○ |
| 1.1 | 0/5 | ○ |
| 1.5 | 0/5 | ○ |

COMPOSITE ELECTRONIC MODULE AND METHOD OF MANUFACTURING COMPOSITE ELECTRONIC MODULE

BACKGROUND OF THE INVENTION

1. Field of the Invention

The present invention relates to a composite electronic module in which a non-reciprocal circuit element is mounted on a substrate and to a method of manufacturing a composite electronic module.

2. Description of the Related Art

To date, non-reciprocal circuit elements, such as isolators and circulators, have been used in composite electronic modules, such as power amplifier modules, of transmission circuit units of communication terminals, such as cellular phones and wireless LAN devices, by utilizing their characteristic of transmitting a signal only in a specific predetermined direction. A non-reciprocal circuit element 500, which is mounted on a substrate that defines a portion of this type of composite electronic module, for example, as illustrated in FIGS. 11A and 11B, includes a ferrite 505 that is sandwiched between a pair of substantially rectangular-parallelepiped-shaped permanent magnets 501 on which central electrodes 503 and 504, which are electrically insulated from each other, are provided on main surfaces 502 of the permanent magnets 501 (refer to, for example, Japanese Unexamined Patent Application Publication No. 2006-311455 (paragraphs [0019] to [0033], FIGS. 1, 2 etc.), Japanese Unexamined Patent Application Publication No. 2007-208943 (paragraphs [0016] to [0037], FIGS. 1, 2, etc.) and Japanese Unexamined Patent Application Publication No. 2009-49879 (paragraphs [0013] to [0032], FIGS. 1, 2, etc.)).

In addition, the ferrite 505 has a substantially rectangular parallelepiped shape and includes relay electrodes 506, which are for respectively electrically connecting the central electrodes 503 and 504 provided on one of the permanent magnets 501 to the central electrodes 503 and 504 provided on the other of the permanent magnets 501, are provided on the surfaces of the upper edge and the lower edge of the ferrite 505. By configuring the non-reciprocal circuit element 500 in this manner, as compared to the configuration of a conventional non-reciprocal circuit element in which a ferrite, around which a copper wire is wound to define as a central electrode, is positioned between a pair of permanent magnets, the non-reciprocal circuit element 500 is easier to manufacture and it is possible to reduce the size of the non-reciprocal circuit element 500. In order to suppress the effect of the magnetic field generated by the permanent magnets 501, a variety of composite electronic modules have been provided, in which the non-reciprocal circuit element 500 has been mounted on a substrate together with a metal yoke that functions as an electromagnetic shield. FIGS. 11A and 11B respectively illustrate an exploded perspective view and a perspective view of an example of the conventional non-reciprocal circuit element 500.

In recent years, together with communication terminals becoming smaller and thinner, a reduction of the size and profile of various composite electronic modules that are mounted in such communication terminals has also been demanded. Accordingly, in order to reduce the size and profile of composite electronic modules, formation of a composite electronic module by mounting the non-reciprocal circuit element 500 on a substrate while omitting a yoke has been considered. If such a configuration is used, since there is no need to provide a space on the substrate in which to mount a yoke, the size and profile of the composite electronic module can be reduced.

However, in this case, since a yoke that would function as an electromagnetic shield is not mounted on the substrate, at the time of forming the composite electronic module, when the non-reciprocal circuit element 500 and an electronic component that includes a magnetic material are mounted together on a substrate, there is risk of the electronic component, which is mounted around the periphery of the non-reciprocal circuit element 500, being shifted by the magnetic force of the permanent magnets 501 and thereby being displaced. Thus, the prevention of such displacement has been demanded.

SUMMARY OF THE INVENTION

To overcome the problems described above, preferred embodiments of the present invention provide a composite electronic module that prevents electronic components that are arranged around the periphery of a non-reciprocal circuit element from being shifted and displaced due to the magnetic force of a permanent magnet, and a method of easily manufacturing such a composite electronic module.

According to a first preferred embodiment of the present invention, a composite electronic module is provided that preferably includes a non-reciprocal circuit element including a permanent magnet, a ferrite, and an electrode pattern, an electronic component that includes a magnetic material, and a substrate on which the non-reciprocal circuit element and the electronic component are mounted, wherein the electronic component is mounted on the substrate so as to be in contact with the non-reciprocal circuit element.

In addition, a coating made of an insulating material may preferably be applied to at least a portion of the non-reciprocal circuit element that is in contact with the electronic component.

Furthermore, the non-reciprocal circuit element may preferably include a pair of permanent magnets and be configured such that the ferrite is arranged between one magnetic pole of one of the permanent magnets and the opposite magnetic pole of the other permanent magnet. The electronic component may preferably include a component that includes a permanent magnet, and the component that includes a permanent magnet may preferably be arranged so as to be in contact with the non-reciprocal circuit element in a direction in which the individual magnetic poles of the pair of permanent magnets of the non-reciprocal circuit element are aligned.

In addition, according to a second preferred embodiment of the present invention, a method of manufacturing a composite electronic module that includes a non-reciprocal circuit element including a permanent magnet, a ferrite and an electrode pattern, an electronic component that includes a magnetic material, and a substrate on which the non-reciprocal circuit element and the electronic component are mounted is provided that preferably includes the step of arranging the non-reciprocal circuit element and the electronic component, which are in contact with each other, at a predetermined position on the substrate.

Furthermore, according to a third preferred embodiment of the present invention, a method of manufacturing a composite electronic module including a non-reciprocal circuit element that includes a permanent magnet, a ferrite and an electrode pattern, an electronic component that includes a magnetic material, and a substrate on which the non-reciprocal circuit element and the electronic component are mounted preferably includes the steps of applying a solder paste to the substrate, arranging the non-reciprocal circuit element and the electronic component so as to be spaced apart from each other at predetermined positions on the substrate, and melting the solder paste by subjecting the substrate on which the non-reciprocal circuit element and the electronic component are arranged at predetermined positions to a reflow process to cause the electronic component and the non-reciprocal circuit element to come into contact with each other as a result of the electronic component being shifted by the magnetic force of the permanent magnet.

According to the first preferred embodiment of the present invention, the electronic component, which may preferably include a magnetic material, is mounted on the substrate so as to be in contact with the non-reciprocal circuit element, which includes the permanent magnet, the ferrite and the electrode pattern, and therefore, for example, even though a metal yoke is omitted, there is no risk of the electronic component, which is arranged so as to be in contact with the non-reciprocal circuit element, being shifted and becoming displaced due to the magnetic force of the permanent magnet, and displacement of the electronic component, which is arranged around the periphery of the non-reciprocal circuit element, due to the electronic component being shifted by the magnetic force of the permanent magnet can be prevented.

In addition, even though a metal yoke or other similar structure is not mounted on the substrate, since there is no risk of the electronic component, which is arranged so as to be in contact with the non-reciprocal circuit element, being shifted and becoming displaced by the magnetic force of the permanent magnet, a space in which to mount a member that would function as an electromagnetic shield, such as a yoke, for example, is not required on the substrate, and therefore, the composite electronic module can be reduced in size and profile.

In addition, the permanent magnet may preferably have conductivity and, in such a case, a coating made of an insulating material is preferably applied to at least a portion of the non-reciprocal circuit element that is in contact with the electronic component and, therefore, even though the non-reciprocal circuit element and the electronic component are arranged so as to be in contact with each other, there is no risk of there being an electrical connection between the non-reciprocal circuit element and the electronic component.

Furthermore, the electronic component may be a component that includes permanent magnet, the non-reciprocal circuit element may preferably include a pair of permanent magnets and be configured such that the ferrite is arranged between one magnetic pole of one of the permanent magnets and the opposite magnetic pole of the other permanent magnet, and the component that includes a permanent magnet is preferentially arranged so as to be in contact with the non-reciprocal circuit element in a direction in which the individual magnetic poles of the pair of permanent magnets of the non-reciprocal circuit element are aligned. Thus, since the magnetic flux applied to the ferrite of the non-reciprocal circuit element is not changed by the permanent magnet included in the electronic component, the electronic component can be arranged so as to be in contact with the non-reciprocal circuit element without causing the characteristics of the non-reciprocal circuit element to change.

According to the second preferred embodiment of the present invention, the non-reciprocal circuit element and the electronic component, which are in contact with each other, are preferably arranged on the substrate at a predetermined position, whereby the composite electronic module, in which the electronic component is mounted on the substrate so as to be in contact with the non-reciprocal circuit element, can be easily manufactured.

According to the third preferred embodiment of the present invention, preferably, after solder paste is applied to the substrate and the non-reciprocal circuit element and the electronic component are arranged so as to be spaced apart from each other at predetermined positions on the substrate, the substrate, on which the non-reciprocal circuit element and the electronic component are arranged at predetermined positions, is subjected to a reflow process, whereby the solder paste is melted and as a result its viscosity is reduced, and the electronic component is shifted by the magnetic force of the permanent magnet and comes into contact with the non-reciprocal circuit element. Thus, the composite electronic module, in which the electronic component is mounted on the substrate so as to be in contact with the non-reciprocal circuit element, can be easily manufactured.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 illustrates an example of experimental results obtained by investigating the effect of the magnetic field of a permanent magnet depending on the arrangement position of an electronic component.

FIG. 3 illustrates an example of experimental results obtained by investigating the effect of the magnetic field of a permanent magnet depending on the arrangement position of an electronic component.

DETAILED DESCRIPTION OF THE PREFERRED EMBODIMENTS

Figure 1A:
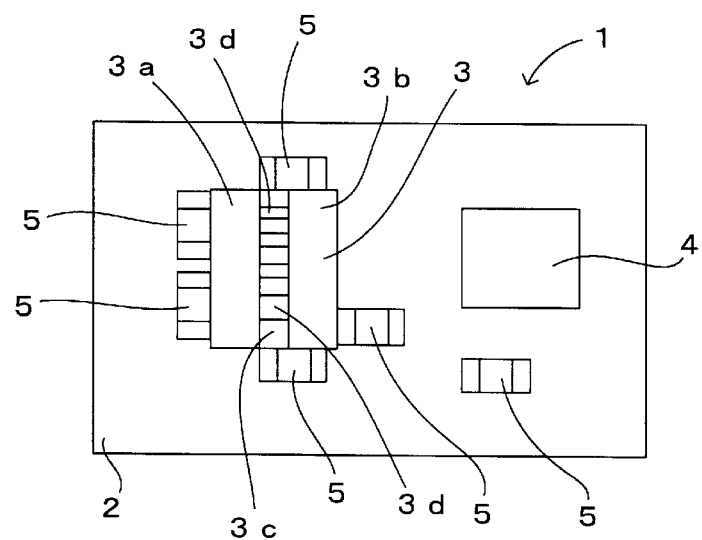
FIGS. 1A and 1B respectively illustrate an arrangement state and a circuit block diagram of a composite electronic module according to a preferred embodiment of the present invention.
Figure 1B:
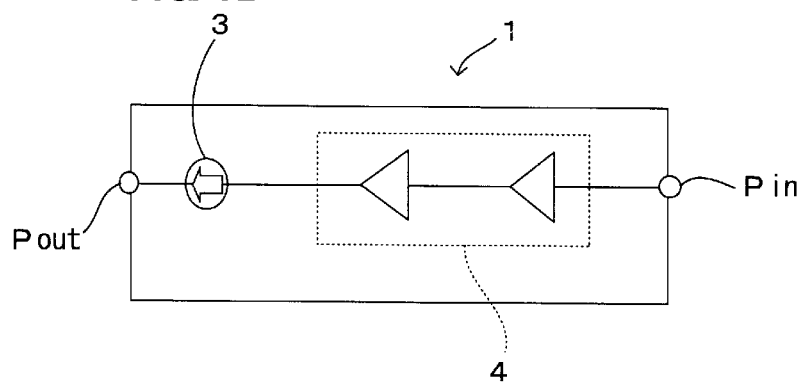
Figure 4:
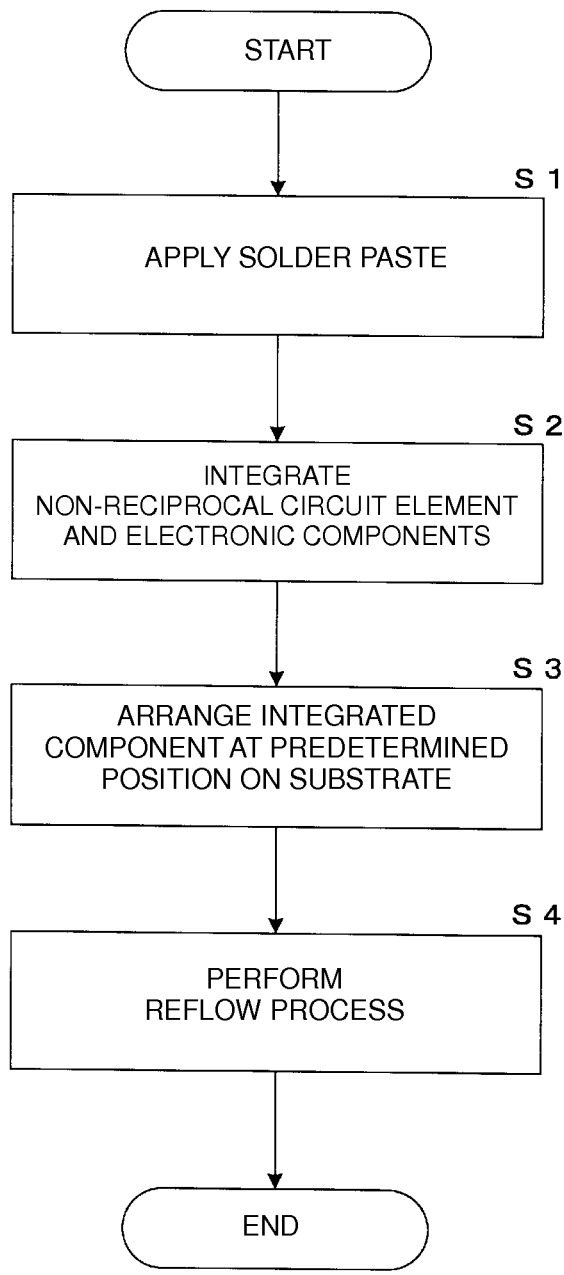
FIG. 4 is a flowchart illustrating an example of a method of manufacturing a composite electronic module according to another preferred embodiment of the present invention.
Figure 5:
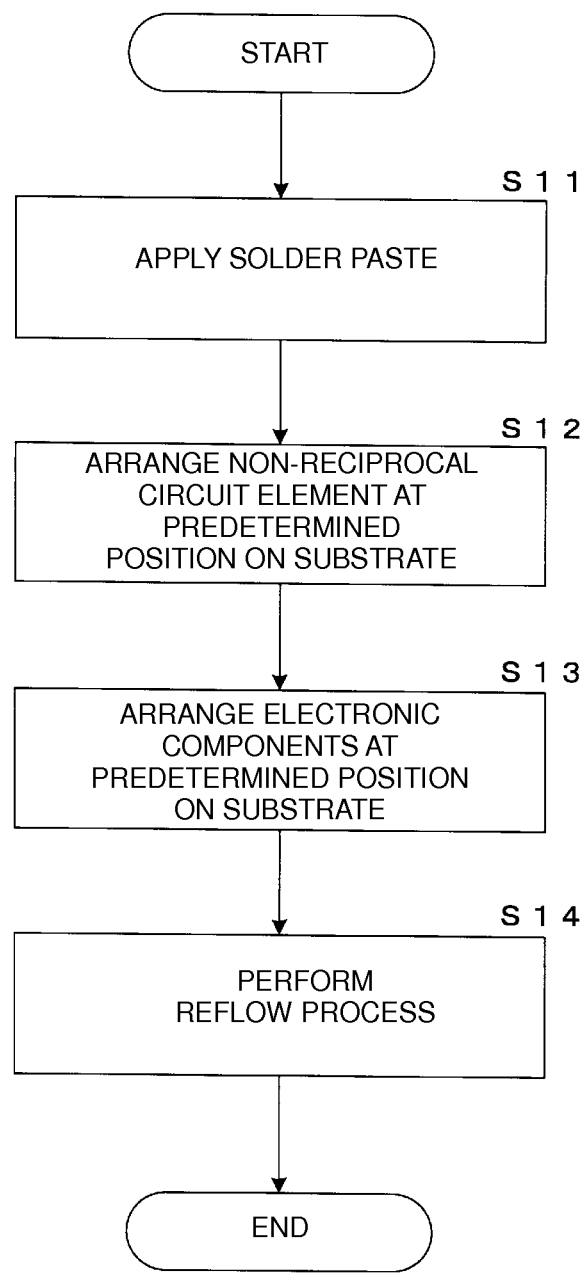
FIG. 5 is a flowchart illustrating another example of a method of manufacturing a composite electronic module according to another preferred embodiment of the present invention.
Figure 6:
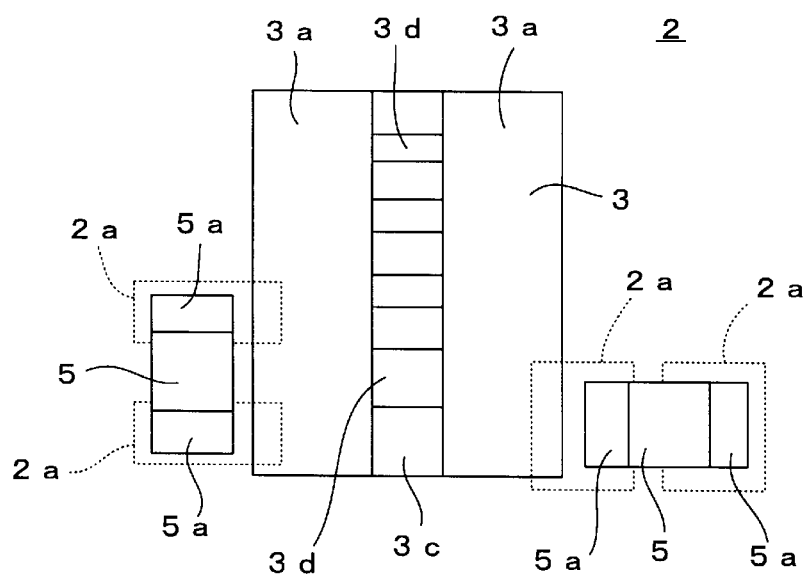
FIG. 6 illustrates a state in which a non-reciprocal circuit element and electronic components are arranged so as to be spaced apart from each other.
Figure 7:
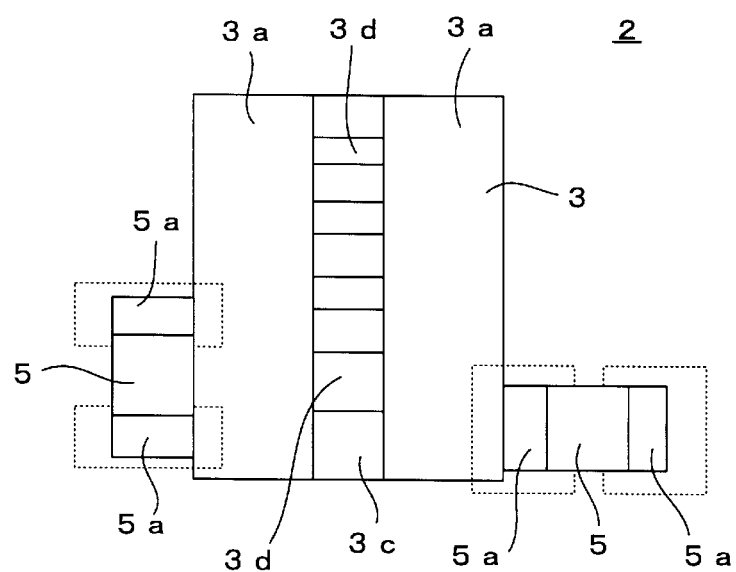
FIG. 7 illustrates a state in which electronic components, which were arranged so as to be spaced apart from a non-reciprocal circuit element, have shifted.

A composite electronic module according to preferred embodiments of the present invention will be described with reference to FIGS. 1A to 5. FIGS. 1A and 1B respectively illustrate an arrangement state and a functional block diagram of a composite electronic module 1 according to a preferred embodiment of the present invention. FIGS. 2 and 3 illustrate examples of experimental results obtained by investigating the effect of the magnetic field of a permanent magnet depending on the arrangement position of an electronic component. FIG. 4 is a flowchart illustrating an example of a method of manufacturing the composite electronic module according to another preferred embodiment of the present invention. FIG. 5 is a flowchart illustrating another example of a method of manufacturing the composite electronic module 1 according to another preferred embodiment of the present invention. FIG. 6 illustrates a state in which a non-reciprocal circuit element 3 and electronic components 5 are arranged so as to be spaced apart from each other. FIG. 7 illustrates a state in which the electronic components 5, which were arranged so as to spaced apart from the non-reciprocal circuit element 3, have shifted, thereby coming into contact with the non-reciprocal circuit element 3.

The composite electronic module 1 illustrated in FIGS. 1A and 1B is preferably a power amplification module, for example, and preferably includes, for example, the non-reciprocal circuit element 3 defined by an isolator that has a characteristic of transmitting a signal in only a predetermined specific direction, a power amplifier 4 that amplifies a transmission signal, and various electronic components 5 mounted on a substrate 2 that is made of a resin, a ceramic, or other suitable material, for example. The composite electronic module 1 is preferably provided in a transmission circuit unit of a communication terminal such as a wireless communication device of a wireless LAN standard or a Bluetooth (registered trademark) standard, or a cellular phone, for example.

As the substrate 2, for example, a multilayer substrate, which is formed by firing a multilayer body including a plurality of ceramic green sheets, or a multilayer resin substrate on which predetermined electrode patterns have been formed is preferably selected and used in accordance with the intended purpose of the composite electronic module 1. Furthermore, depending on the intended use of the composite electronic module 1, a substrate into which electronic components, such as capacitors or coils, for example, have been built in may be used as the substrate 2.

The non-reciprocal circuit element 3 preferably includes a pair of permanent magnets 3a and 3b, and a ferrite 3c, and is configured such that the ferrite 3c is arranged between one magnetic pole of the permanent magnet 3a and the opposite magnetic pole of the other permanent magnet 3b. Specifically, the permanent magnets 3a and 3b and the ferrite 3c preferably have substantially rectangular parallelepiped shapes and the permanent magnets 3a and 3b and the ferrite 3c are connected to each other such that the magnetic fields of the permanent magnets 3a and 3b are applied substantially perpendicularly to the main surfaces of the ferrite 3c. In addition, an electrode pattern 3d, which defines a central electrode, is preferably provided on a main surface on the side of the one magnetic pole of the permanent magnet 3a, on a main surface on the side of the opposite pole of the other permanent magnet 3b and on an upper edge surface and a lower edge surface of the ferrite 3c. When the permanent magnets 3a and 3b and the ferrite 3c are connected to each other, the electrode pattern 3d is wound around the ferrite 3c and, by appropriately adjusting this winding state, the electrical characteristics of the non-reciprocal circuit element 3, such as the input impedance and the insertion loss, can be adjusted.

The electrode pattern 3d, which is provided on the main surfaces of the permanent magnets 3a and 3b, is preferably formed as a thin film by printing or transferring an electrode film material composed of silver, copper, gold or an alloy of these metals, for example, or an electrode film material, such as a conductive composite material (paste or adhesive) composed of for example a conductive powder, such as gold or silver powder, and an epoxy resin, for example. In addition, any of these electrode film materials and a photosensitive material may be mixed together and the electrode pattern 3d may be formed in a predetermined shape on the main surfaces of the permanent magnets 3a and 3b using processing techniques, such as photolithography and etching, for example.

In addition, portions of the electrode pattern 3d provided on the upper edge surface and the lower edge surface of the ferrite 3c define connective electrodes arranged to connect the non-reciprocal circuit element 3 to relay electrodes, which relay the portions of the electrode pattern 3d provided on the main surfaces of the permanent magnets 3a and 3b to each other, and to the substrate 2, and are preferably formed as thick films by printing or transferring an electrode film material composed of silver, copper, gold, or an alloy of these metals, for example, or an electrode film material, such as a conductive composite material (paste or adhesive) composed of for example a conductive powder, such as gold or silver powder, and an epoxy resin, for example. In addition, any of these electrode film materials and a photosensitive material may be mixed together and the electrode pattern 3d may be formed in a predetermined shape on the upper edge surface and the lower edge surface of the ferrite 3c using processing techniques, such as photolithography and etching, for example.

Furthermore, as materials of the permanent magnets 3a and 3b, for example, the following materials may preferably be used: a strontium ferrite magnetic material, which is excellent in terms of magnetic characteristics of residual magnetic flux density and coercivity and is excellent in terms of isolation characteristics (characteristic of low loss) in a high frequency band, or a lanthanum-cobalt ferrite magnetic material that is excellent in terms of magnetic characteristics of residual magnetic flux density and coercivity, is suitable for size reduction and can be used even taking into consideration isolation characteristics in a high frequency band.

Furthermore, a coating made of an insulating material, such as a resin or other suitable material, for example, is preferably applied onto at least portions of the non-reciprocal circuit element 3 that are in contact with the electronic components 5.

In addition, preferably, the non-reciprocal circuit element 3 is arranged on the substrate 2 at a position that is at a distance of about 1.2 mm or more, for example, from an edge of the substrate in an X direction, which is a direction in which the individual magnetic poles of the permanent magnets 3a and 3b are aligned (left/right direction in the plane of the paper in FIG. 1A) and is arranged on the substrate 2 at a position that is at a distance of about 0.8 mm or more, for example, from an edge of the substrate 2 in a Y direction, which is a direction perpendicular or substantially perpendicular to the direction in which the individual magnetic poles of the permanent magnets 3a and 3b are aligned (up/down direction in plane of the paper in FIG. 1A).

With the above-described configuration, for example, when the composite electronic module 1 is mounted on a mother substrate, various electronic components, which are mounted around the composite electronic module 1 on the mother substrate, are arranged on the mother substrate so as to be spaced apart from the substrate 2 of the composite electronic module 1 preferably by a distance of about 0.1 mm and, therefore, the distance between the electronic components arranged on the mother substrate and the non-reciprocal circuit element 3 included in the composite electronic module 1 is preferably about 1.3 mm or more in the X direction and about 0.9 mm or more in the Y direction.

The inventors of the present invention counted the number of times that an electronic component was shifted, tilted or rotated by the magnetic force of the permanent magnets 3a and 3b, in a case in which an electronic component, such as a chip capacitor, a chip coil, or a chip resistor, for example, that includes a magnetic material, such as Ni in an outer electrode or other magnetic material, for example, was repeatedly positioned five times at different distances in the X direction from the non-reciprocal circuit element 3, that is, in the direction in which the individual magnetic poles of the permanent magnets 3a and 3b are aligned. FIG. 2 illustrates the number of times that an electronic component was shifted, tilted, or rotated by the magnetic force due to the magnetic fields produced by the permanent magnets 3a and 3b, in the case in which an electronic component, such as a chip capacitor, a chip coil or a chip resistor, for example, that includes a magnetic material, such as Ni in an outer electrode or other magnetic material was repeatedly positioned five times at different distances in the X direction from the non-reciprocal circuit element 3, that is, in the direction in which the individual magnetic poles of the permanent magnets 3a and 3b are aligned.

As illustrated in FIG. 2, when an electronic component was arranged at positions at a distance of about 1.1 mm or less in the X direction from the non-reciprocal circuit element 3, the electronic component was almost always shifted, tilted, or rotated. It is thought that, since the distance between the electronic component and the permanent magnets 3a and 3b was relatively small, the electronic component was affected by the magnetic fields of the permanent magnets 3a and 3b. On the other hand, when the electronic component was arranged at positions at a distance about 1.3 mm or more in the X direction from the non-reciprocal circuit element 3, the electronic component was not shifted, tilted, or rotated at all. It is thought that this was because the electronic component was negligibly affected by the magnetic field of the permanent magnets 3a and 3b, since the distance between the electronic component and the permanent magnets 3a and 3b is sufficiently large.

Furthermore, the inventors of the present invention counted the number of times that an electronic component was shifted, tilted, or rotated by the magnetic force of the permanent magnets 3a and 3b, in a case in which an electronic component, such as a chip capacitor, a chip coil or a chip resistor, for example, that includes a magnetic material, such as Ni in an outer electrode or other magnetic material, for example, was repeatedly positioned five times at different distances in the Y direction from the non-reciprocal circuit element 3, that is, in a direction perpendicular or substantially perpendicular to that in which the individual magnetic poles of the permanent magnets 3a and 3b are aligned. FIG. 3 illustrates the number of times that an electronic component was shifted, tilted, or rotated by the magnetic force due to the magnetic fields produced by the permanent magnets 3a and 3b, in the case in which an electronic component, such as a chip capacitor, a chip coil or a chip resistor, for example, that includes a magnetic material such as Ni in an outer electrode or other magnetic material, for example, was repeatedly positioned five times at different distances in the Y direction from the non-reciprocal circuit element 3, that is, in a direction perpendicular or substantially perpendicular to that in which the individual magnetic poles of the permanent magnets 3a and 3b are aligned.

As illustrated in FIG. 3, when an electronic component was arranged at positions at a distance of about 0.7 mm or less in the Y direction from the non-reciprocal circuit element 3, the electronic component was almost always shifted, tilted, or rotated. It is thought that, since the distance between the electronic component and the permanent magnets 3a and 3b was relatively small, the electronic component was affected by the magnetic fields of the permanent magnets 3a and 3b. On the other hand, when the electronic component was arranged at positions at a distance about 0.9 mm or more in the Y direction from the non-reciprocal circuit element 3, the electronic component was not shifted, tilted, or rotated at all. It is thought that this is because the electronic component was negligibly affected by the magnetic fields of the permanent magnets 3a and 3b, since the distance between the electronic component and the permanent magnets 3a and 3b was sufficiently large.

Therefore, by configuring the composite electronic module 1 by appropriately setting the distance from the edge of the substrate 2 to the non-reciprocal circuit element 3 and then mounting the non-reciprocal circuit element 3 on the substrate 2, when the composite electronic module 1 and other electronic components are mounted together on a mother substrate or other suitable substrate, an appropriate gap can be provided between electronic components, which are arranged around the periphery of the composite electronic module 1 on the mother substrate, and the non-reciprocal circuit element 3 mounted in the composite electronic module 1. Therefore, the displacement of an electronic component arranged around the periphery of the composite electronic module 1 due to the electronic component being shifted, tilted, or rotated due to the effect of the magnetic fields of the permanent magnets 3a and 3b of the non-reciprocal circuit element 3 is effectively prevented, despite there being no members or components that are in contact with and support the electronic component.

The power amplifier 4, for example, preferably has a function of amplifying a transmission signal or a function of amplifying a transmission signal in a high frequency band in accordance with the intended use of the composite electronic module 1 and may have any of various suitable circuit configurations.

The electronic components 5 include various circuits that are necessary to form the composite electronic module 1, such as a matching circuit, for example, and therefore, for example, chip capacitors, chip coils and chip resistors are appropriately chosen and mounted on the substrate 2. In this preferred embodiment, the electronic components 5, which include a magnetic material, such as Fe, Co or Ni, for example, in outer electrodes, internal electrode patterns, and other components, for example, are mounted on the substrate 2 so as to be in contact with the non-reciprocal circuit element 3.

In this preferred embodiment, as illustrated in FIG. 1B, a transmission signal input through an input port Pin is amplified by the power amplifier 4 and the amplified transmission signal is output from an output port Pout through the non-reciprocal circuit element 3 are preferably provided in the composite electronic module 1. In FIG. 1B, only the function of the composite electronic module 1 is illustrated and illustration of the circuit configuration of the matching circuit and other components is omitted.

An example of a method of manufacturing the composite electronic module 1 according to a preferred embodiment of the present invention will now be described with reference to FIG. 4. First, solder paste is applied where necessary on the substrate 2 (Step S1). Then, the non-reciprocal circuit element 3 and the electronic components 5 are integrated with each other by attaching the electronic components 5 at predetermined positions to the non-reciprocal circuit element 3 via the magnetic force of the permanent magnets 3a and 3b of the non-reciprocal circuit element 3 or through an adhesive (Step S2).

Next, the integrated non-reciprocal circuit element 3 and electronic components 5 are arranged at a predetermined position on the substrate 2 (Step S3) and the substrate 2, on which the non-reciprocal circuit element 3 and the electronic components 5 have been arranged at a predetermined position, is subjected to a reflow process (Step S4), thereby completing the manufacture of the composite electronic module 1, in which the electronic components 5 are mounted on the substrate 2 so as to be in contact with the non-reciprocal circuit element 3.

With the above-described method, the non-reciprocal circuit element 3 and the electronic components 5, which are in contact with each other, are preferably arranged on the substrate 2 at a predetermined position, whereby the composite electronic module 1, in which the electronic components 5 are mounted on the substrate 2 so as to be in contact with the non-reciprocal circuit element 3, can be easily manufactured.

Another example of a method of manufacturing the composite electronic module 1 according to a preferred embodiment of the present invention will be described with reference to FIGS. 5 to 7. As another example of a manufacturing method illustrated in FIG. 5, an example in which the electronic components 5, such as chip capacitors, chip coils and chip resistors, for example, including outer electrodes 5a are mounted on the substrate 2, will be described.

First, solder paste is applied where necessary on the substrate 2 (Step S11). Then, as illustrated in FIG. 6, the non-reciprocal circuit element 3 is arranged at a predetermined position on the substrate 2 (Step S12), and the electronic components 5 are arranged at predetermined positions on the substrate 2 so as to be spaced apart from the non-reciprocal circuit element 3 (Step S13).

At this time, as illustrated in FIG. 6, electrode pads 2a are formed at predetermined positions on the substrate 2, and the electronic components 5 are arranged on the substrate 2 by aligning the outer electrodes 5a of the individual electronic components 5 and the electrode pads 2a with one another. The solder paste coated onto the electrode pads 2a preferably has a certain degree of viscosity. Therefore, the electronic components 5, which have been arranged so as to be spaced apart from the non-reciprocal circuit element 3, resist the magnetic force of the permanent magnets 3a and 3b of the non-reciprocal circuit element 3 through the adhesive force of the solder paste and remain on the electrode pads 2a.

Next, as illustrated in FIG. 7, the substrate 2, on which the non-reciprocal circuit element 3 and the electronic components 5 have been arranged at predetermined positions, is subjected to a reflow process and as a result the solder paste melts and the adhesive force of the solder paste is weakened. Thus, the substrate 2 cools and the solder paste solidifies in a state in which the electronic components 5, which include a magnetic material, have been caused to shift by the magnetic force of the permanent magnets 3a and 3b and have come into contact with the non-reciprocal circuit element 3 (Step S14). As a result, manufacture of the composite electronic module 1, in which the electronic components 5 have been mounted on the substrate 2 so as to be in contact with the non-reciprocal circuit element 3, is complete.

The electrode pads 2a, which are formed on the substrate 2 at predetermined positions, are preferably formed so as to have a shape that is slightly larger than that of the outer electrodes 5a by estimating the distance over which the electronic components 5 will be shifted in the directions in which the electronic components 5 will be shifted by the magnetic force, such that even when the electronic components 5, which have been arranged so as to be spaced apart from the non-reciprocal circuit element 3, are shifted by being attracted toward the non-reciprocal circuit element 3 by the magnetic force of the permanent magnets 3a and 3b of the non-reciprocal circuit element 3, the state of electrical contact between the electrode pads 2a and the outer electrodes 5a of the electronic components 5 is maintained.

Furthermore, when the electronic components 5 have been arranged on the substrate 2 at predetermined positions, even though the electronic components 5 are shifted due to the magnetic force of the permanent magnets 3a and 3b exceeding the adhesive force of the solder paste and come into contact with the non-reciprocal circuit element 3, since the electronic components 5 and the non-reciprocal circuit element 3 are preferably mounted on the substrate 2 so as to be in contact with each other through the reflow process being performed in a state in which the non-reciprocal circuit element 3 and the electronic components 5 come into contact with each other, no problems arise.

With this method, after solder paste is applied to the substrate 2 and the non-reciprocal circuit element 3 and the electronic components 5 are arranged at predetermined positions on the substrate 2 so as to be spaced apart from each other, the substrate 2, on which the non-reciprocal circuit element 3 and the electronic components 5 are arranged at predetermined positions, is subjected to a reflow process, whereby the solder paste is melted and as a result its viscosity is reduced, and the electronic components 5 are shifted by the magnetic force of the permanent magnets 3a and 3b and come into contact with the non-reciprocal circuit element 3. Thus, the composite electronic module 1, in which the electronic components 5 are mounted on the substrate 2 so as to be in contact with the non-reciprocal circuit element 3, can be easily manufactured.

According to the above-described preferred embodiments, the electronic components 5, which include magnetic materials, are preferably mounted on the substrate 2 so as to be in contact with the non-reciprocal circuit element 3, which includes the permanent magnets 3a and 3b, the ferrite 3c and the electrode pattern 3d, and, therefore, for example, even though a metal yoke is omitted, there is no risk of the electronic components 5, which are arranged so as to be in contact with the non-reciprocal circuit element 3, shifting and becoming displaced due to the magnetic force of the permanent magnets 3a and 3b, and displacement of the electronic components 5, which are arranged around the periphery of the non-reciprocal circuit element 3, due to the electronic components 5 being shifted by the magnetic force of the permanent magnets 3a and 3b is effectively prevented.

In addition, even though a metal yoke or other similar structure is not mounted on the substrate 2, since there is no risk of the electronic components 5, which are arranged so as to be in contact with the non-reciprocal circuit element 3, being shifted and becoming displaced by the magnetic force of the permanent magnets 3a and 3b, a space in which to mount a member that would function as an electromagnetic shield, such as a yoke, for example, need not be provided on the substrate 2 and, therefore, the composite electronic module 1 can be reduced in size and profile.

Furthermore, if the electronic components 5 are arranged so as to spaced apart from the non-reciprocal circuit element 3 at positions at which there is no effect from the magnetic force of the permanent magnets 3a and 3b of the non-reciprocal circuit element 3, the size of the gap between the non-reciprocal circuit element 3 and the electronic elements 5 is increased, thus preventing a reduction of the size of the composite electronic module 1. According to preferred embodiments of the present invention, since the non-reciprocal circuit element 3 and the electronic components 5 are arranged so as to be in contact with each other, the distance between the non-reciprocal circuit element 3 and the electronic components 5 is zero and, thus, as compared to a module formed by arranging the non-reciprocal circuit element 3 and the electronic components 5 on the substrate 2 so as to be spaced apart from each other using a mounting device, the composite electronic module 1 can be reduced in size.

In addition, the permanent magnets 3a and 3b are conductive and a coating made of an insulating material is preferably applied to at least portions of the non-reciprocal circuit element 3 that are in contact with the electronic components 5. Therefore, even though the non-reciprocal circuit element 3 and the electronic components 5 are in contact with each other, there is no risk of there being an electrical connection between the non-reciprocal circuit element 3 and the electronic components 5.

Furthermore, as a result of the non-reciprocal circuit element 3 and the electronic components 5 being mounted on the substrate 2 so as to be in contact with each other in an integrated manner, as compared to a case in which the non-reciprocal circuit element 3 and the electronic components 5 are individually arranged on the substrate 2, the non-reciprocal circuit element 3 and the electronic components 5 are integrated on the substrate 2 through being mounted and since the electronic components 5 are supported by the non-reciprocal circuit element 3, instability of mounted components is prevented and the mechanical strength of the composite electronic module 1 is improved.

Figure 8:
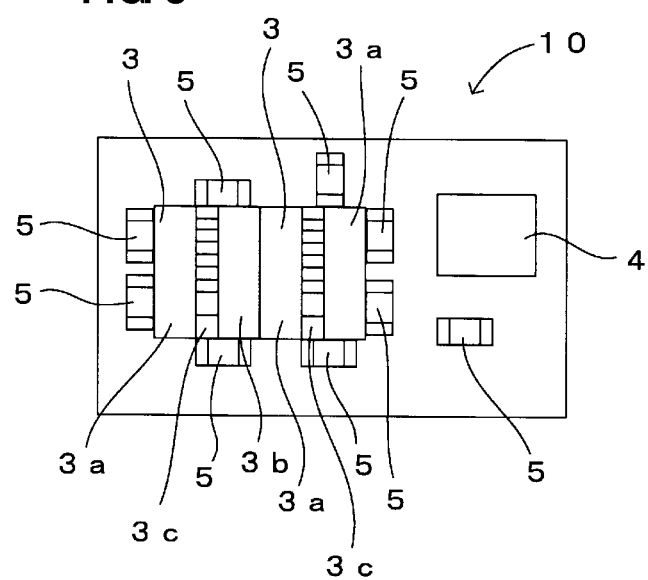
FIG. 8 illustrates a composite electronic module according to another preferred embodiment of the present invention.

Another preferred embodiment of a composite electronic module according to the present invention will now be described with reference to FIG. 8. FIG. 8 illustrates a composite electronic module 10 according to another preferred embodiment of the present invention. This preferred embodiment is different from the above-described preferred embodiment in that two non-reciprocal circuit elements 3, each of which includes permanent magnets 3a and 3b, are preferably arranged in a state in which opposing magnetic poles are in contact with each other in a direction in which the individual magnetic poles of the pairs of permanent magnets 3a and 3b are aligned. The remaining aspects of this configuration are similar to those of the above-described preferred embodiment, and therefore, the same symbols are used to denote the structure thereof and repeated description thereof is omitted.

With this configuration, the two non-reciprocal circuit elements 3, each of which includes the permanent magnets 3a and 3b, are preferably arranged so as to be in contact with each other and so as to be in contact with each other in a direction in which the individual magnetic poles of the pairs of permanent magnets 3a and 3b of the non-reciprocal circuit elements 3 are aligned. Therefore, since the magnetic flux applied to the ferrite 3 of one of the non-reciprocal circuit elements 3 is not changed by the permanent magnets 3a and 3b included in the other non-reciprocal circuit element 3, the pair of non-reciprocal circuit elements 3 can be arranged so as to be in contact with each other without causing the characteristics of the non-reciprocal circuit elements 3 to change.

When components that include permanent magnets are arranged so as to be in contact with a non-reciprocal circuit element 3, by arranging the components that include permanent magnets so as to be in contact with the non-reciprocal circuit element 3 in a direction in which the individual magnetic poles of the pair of permanent magnets 3a and 3b of the non-reciprocal circuit element 3 are aligned, as described above, the component that includes permanent magnets can be arranged so as to be in contact with the non-reciprocal circuit element 3 without causing the characteristics of the non-reciprocal circuit element 3 to change.

Figure 9:
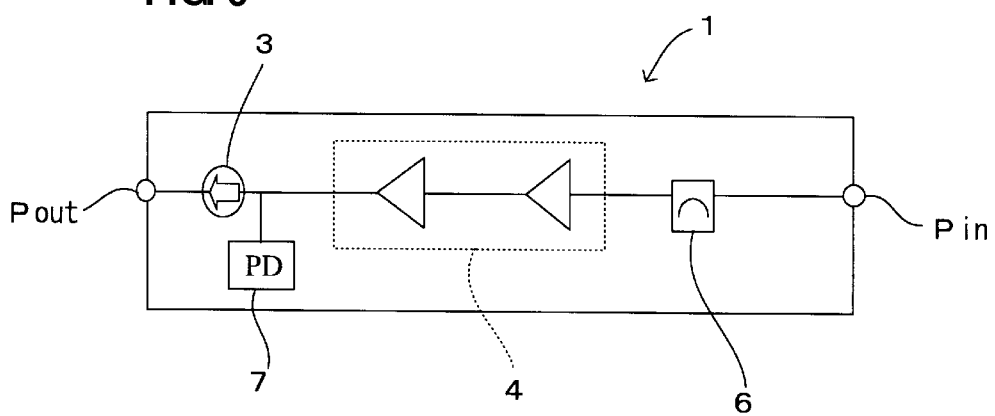
FIG. 9 is a circuit block diagram of a composite electronic module according to another preferred embodiment of the present invention.
Figure 10:
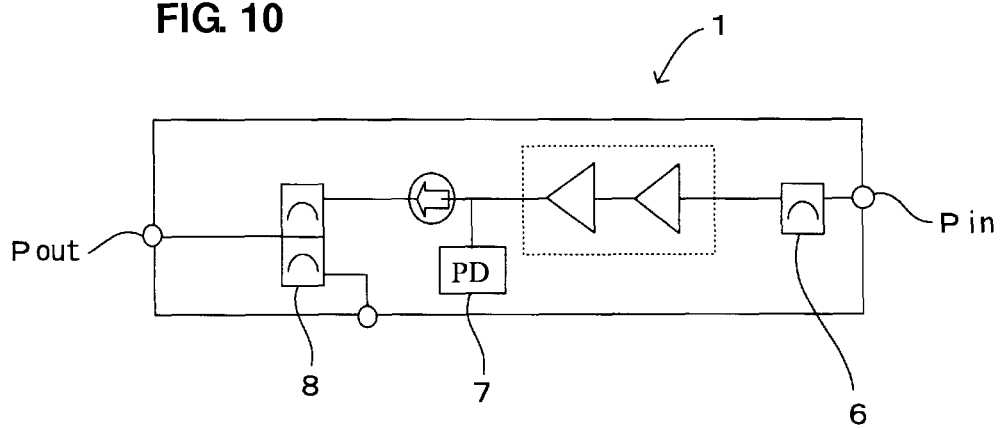
FIG. 10 is a circuit block diagram of a composite electronic module according to another preferred embodiment of the present invention.
Figure 11A:
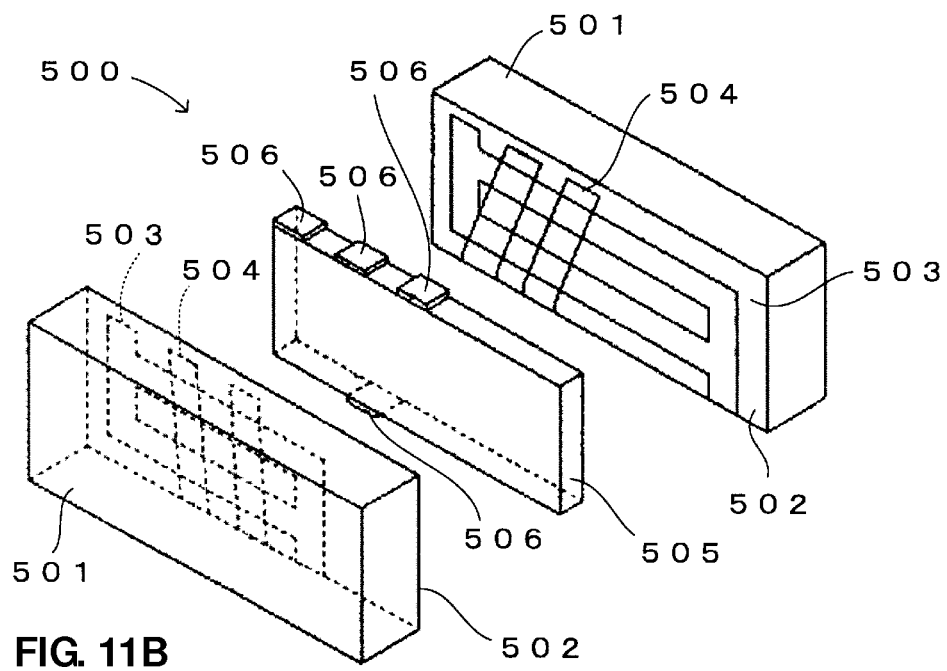
FIGS. 11A and 11B illustrate an example of a conventional non-reciprocal circuit element.
Figure 11B:
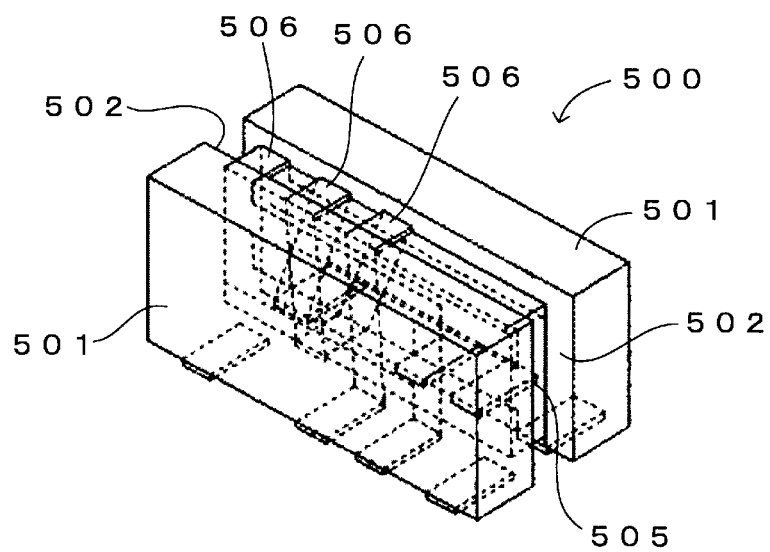

The present invention is not limited to the above-described preferred embodiments and it is possible to make various modifications not described above as long as they do not depart from the spirit and scope of the present invention. For example, as illustrated in FIG. 9, an interstage filter 6 (SAW filter) and a power detector 7 may preferably be additionally mounted in the composite electronic module 1, or as illustrated in FIG. 10, a duplexer 8 may preferably be additionally mounted in the composite electronic module 1. In addition, although not illustrated, a switch, a multiplexer, such as a diplexer, and a coupler, for example, may be mounted in the composite electronic module 1. FIG. 9 and FIG. 10 are circuit block diagrams of different examples of a composite electronic module.

In addition, the composite electronic module 1 may preferably include a cover made of a non-magnetic metal or a magnetic metal, for example, or may be subjected to molding using a resin, for example.

Furthermore, the non-reciprocal circuit element 3 is not limited to being an isolator as in the above-described configuration, and a well-known isolator having another configuration may be appropriately provided the non-reciprocal circuit element 3. Furthermore, the non-reciprocal circuit element 3 may also be a circulator.

In addition, although it is preferable that the electronic components 5, which are arranged so as to be in contact with the non-reciprocal circuit element 3, be chip resistors and chip capacitors whose characteristics and behaviors are negligibly affected by the magnetic fields of the permanent magnets 3a and 3b, the electronic components 5 may alternatively be chip coils, compact loudspeakers, or microphones, for example, whose characteristics and behaviors are greatly affected by magnetic fields and may be arranged so as to be contact with the non-reciprocal circuit element 3 by taking into consideration the effect of the magnetic fields of the permanent magnets 3a and 3b during the design stage of the composite electronic module 1.

Furthermore, the electronic components provided on the substrate 2 are not limited to the above-described examples and appropriate or optimal electronic components may be selected in accordance with the intended use and design of the composite electronic module 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite electronic module comprising:
  a non-reciprocal circuit element including a permanent magnet, a ferrite, and an electrode pattern;
  an electronic component including a magnetic material; and
  a substrate on which the non-reciprocal circuit element and the electronic component are mounted; wherein
  the electronic component is mounted on the substrate so as to be in contact with the non-reciprocal circuit element.

2. The composite electronic module according to claim 1, wherein a coating made of an insulating material is applied to at least a portion of the non-reciprocal circuit element that is in contact with the electronic component.

3. The composite electronic module according to claim 1, wherein the non-reciprocal circuit element includes a pair of permanent magnets and is configured such that the ferrite is arranged between one magnetic pole of one of the pair of permanent magnets and an opposite magnetic pole of the other of the pair of permanent magnets;

the electronic component includes a component that includes a permanent magnet; and the component that includes a permanent magnet is arranged so as to be in contact with the non-reciprocal circuit element in a direction in which the magnetic poles of the pair of permanent magnets of the non-reciprocal circuit element are aligned.

4. A method of manufacturing a composite electronic module including a non-reciprocal circuit element that includes a permanent magnet, a ferrite and an electrode pattern, an electronic component that includes a magnetic material; and a substrate on which the non-reciprocal circuit element and the electronic component are mounted, the method comprising the step of:

arranging the non-reciprocal circuit element and the electronic component so as to be in contact with each other and at a predetermined position on the substrate.

5. A method of manufacturing a composite electronic module including a non-reciprocal circuit element that includes a permanent magnet, a ferrite, and an electrode pattern, an electronic component that includes a magnetic material, and a substrate on which the non-reciprocal circuit element and the electronic component are mounted, the method comprising the steps of:

applying a solder paste to the substrate;

arranging the non-reciprocal circuit element and the electronic component so as to be spaced apart from each other at predetermined positions on the substrate; and melting the solder paste by subjecting the substrate on which the non-reciprocal circuit element and the electronic component are arranged at predetermined positions to a reflow process to cause the electronic component and the non-reciprocal circuit element to come into contact with each other as a result of the electronic component being shifted by the magnetic force of the permanent magnet.

* * * * *